United States Patent
Umeda et al.

(10) Patent No.: US 12,114,554 B2
(45) Date of Patent: Oct. 8, 2024

(54) LIGHT-EMITTING DEVICE INCLUDING COMPLEMENTARY COLOR LIGHT ABSORPTION LAYER

(71) Applicant: SHARP KABUSHIKI KAISHA, Sakai (JP)

(72) Inventors: Tokiyoshi Umeda, Sakai (JP); Yuto Tsukamoto, Sakai (JP); Bai Zhang, Sakai (JP); Shinichi Kawato, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 517 days.

(21) Appl. No.: 17/273,690

(22) PCT Filed: Sep. 11, 2018

(86) PCT No.: PCT/JP2018/033704
§ 371 (c)(1),
(2) Date: Mar. 4, 2021

(87) PCT Pub. No.: WO2020/053974
PCT Pub. Date: Mar. 19, 2020

(65) Prior Publication Data
US 2021/0320151 A1 Oct. 14, 2021

(51) Int. Cl.
*H10K 59/38* (2023.01)
*H10K 50/80* (2023.01)
(Continued)

(52) U.S. Cl.
CPC ........... *H10K 59/38* (2023.02); *H10K 50/844* (2023.02); *H10K 50/868* (2023.02); *H10K 50/115* (2023.02); *H10K 50/15* (2023.02); *H10K 50/16* (2023.02); *H10K 50/818* (2023.02); *H10K 50/828* (2023.02)

(58) Field of Classification Search
CPC .... H10K 50/844; H10K 50/868; H10K 50/00; H10K 50/86; H10K 50/15; H10K 50/16; H10K 50/115; H10K 50/818; H10K 50/828; H10K 59/38; G02B 5/20; G02B 5/30;
(Continued)

(56) References Cited

U.S. PATENT DOCUMENTS 9,786,721 B1 10/2017 Tang
2002/0054269 A1* 5/2002 Maeda .............. G02F 1/133555
349/181
(Continued)

FOREIGN PATENT DOCUMENTS

JP 2012028058 A 2/2012
JP 2016039151 A 3/2016
(Continued)

*Primary Examiner* — Ida M Soward
(74) *Attorney, Agent, or Firm* — ScienBiziP, P.C.

(57) ABSTRACT

The light-emitting device includes a light-emitting element in which a first electrode, a light-emitting layer, and a second electrode are sequentially layered toward a side of a light-emitting face. Further, the light-emitting device includes, on a side of the light-emitting face of the second electrode, a complementary color light absorption layer configured to absorb complementary color light of light emitted by the light-emitting element.

16 Claims, 5 Drawing Sheets

(51) Int. Cl.
  *H10K 50/84*  (2023.01)
  *H10K 50/844*  (2023.01)
  *H10K 50/115*  (2023.01)
  *H10K 50/15*  (2023.01)
  *H10K 50/16*  (2023.01)
  *H10K 50/818*  (2023.01)
  *H10K 50/828*  (2023.01)

(58) Field of Classification Search
  CPC ........... G09F 9/30; H05B 33/02; H05B 33/12; H05B 33/22
  See application file for complete search history.

(56) References Cited

U.S. PATENT DOCUMENTS

| | | | |
|---|---|---|---|
| 2007/0069635 A1* | 3/2007 | Cok | H10K 50/865 313/504 |
| 2007/0200496 A1* | 8/2007 | Cok | H10K 50/854 313/512 |
| 2008/0054802 A1* | 3/2008 | Cok | H10K 50/865 313/506 |
| 2010/0060756 A1* | 3/2010 | Inuiya | H01L 27/14621 348/280 |
| 2011/0284898 A1* | 11/2011 | Iwasaki | H10K 50/844 257/98 |
| 2011/0317107 A1* | 12/2011 | Chang | G02F 1/1368 349/110 |
| 2013/0207539 A1 | 8/2013 | Fang et al. | |
| 2014/0312339 A1* | 10/2014 | Fujita | H10K 59/35 257/40 |
| 2015/0187857 A1* | 7/2015 | Negishi | H10K 59/8792 257/40 |
| 2015/0188091 A1* | 7/2015 | Kudo | G06F 30/00 703/1 |
| 2016/0043336 A1* | 2/2016 | Kim | H10K 59/40 257/40 |
| 2016/0043338 A1 | 2/2016 | Seo et al. | |
| 2016/0260930 A1* | 9/2016 | Seo | H10K 59/876 |
| 2016/0322437 A1* | 11/2016 | Sakamoto | H10K 59/122 |
| 2017/0098690 A1* | 4/2017 | Lee | H10K 50/865 |
| 2017/0179435 A1 | 6/2017 | Seo et al. | |
| 2017/0243930 A1* | 8/2017 | Kondo | H10K 71/00 |
| 2017/0271420 A1* | 9/2017 | Tsai | H10K 59/00 |
| 2018/0097204 A1* | 4/2018 | Ivan | H10K 71/00 |
| 2018/0182819 A1* | 6/2018 | Jo | G06F 3/0412 |
| 2018/0197921 A1* | 7/2018 | Kim | H10K 50/865 |
| 2018/0342560 A1* | 11/2018 | Ma | H10K 50/865 |

FOREIGN PATENT DOCUMENTS

| | | | | |
|---|---|---|---|---|
| JP | 2017224398 A | | 12/2017 | |
| KR | 20120133955 A | | 12/2012 | |
| KR | 20140124615 A | * | 10/2014 | ........... H10K 59/123 |
| KR | 20170073989 A | * | 6/2017 | ............. H10K 59/12 |
| KR | 20170080309 A | * | 7/2017 | ............. G02F 1/136 |
| KR | 101957147 B1 | * | 3/2019 | ......... H10K 50/8426 |

* cited by examiner

LIGHT-EMITTING DEVICE INCLUDING COMPLEMENTARY COLOR LIGHT ABSORPTION LAYER

TECHNICAL FIELD

The disclosure relates to a light-emitting device including a light-emitting element.

BACKGROUND ART

PTL 1 describes an image display device including an optical film having a function of a circular polarizer for the purpose of prevention of external light reflection.

CITATION LIST

Patent Literature

PTL 1: JP 2017-224398 A

SUMMARY

Technical Problem

A display device provided with a circular polarizer has a problem that a film thickness of a device increases by the film thickness of the circular polarizer.

Solution to Problem

In order to solve the above problem, a light-emitting device according to the disclosure includes a light-emitting face, and a light-emitting element in which a first electrode, a light-emitting layer, and a second electrode are sequentially layered toward a side of the light-emitting face. The light-emitting device includes a complementary color light absorption layer on the side of the light-emitting face of the second electrode, and the complementary color light absorption layer absorbs complementary color light of light emitted by the light-emitting element.

Advantageous Effects of Disclosure

With configuration described above, installation of a circular polarizer on the light-emitting device can be omitted, and the film thickness of the light-emitting device can be easily reduced.

DESCRIPTION OF EMBODIMENTS

Figure 1:
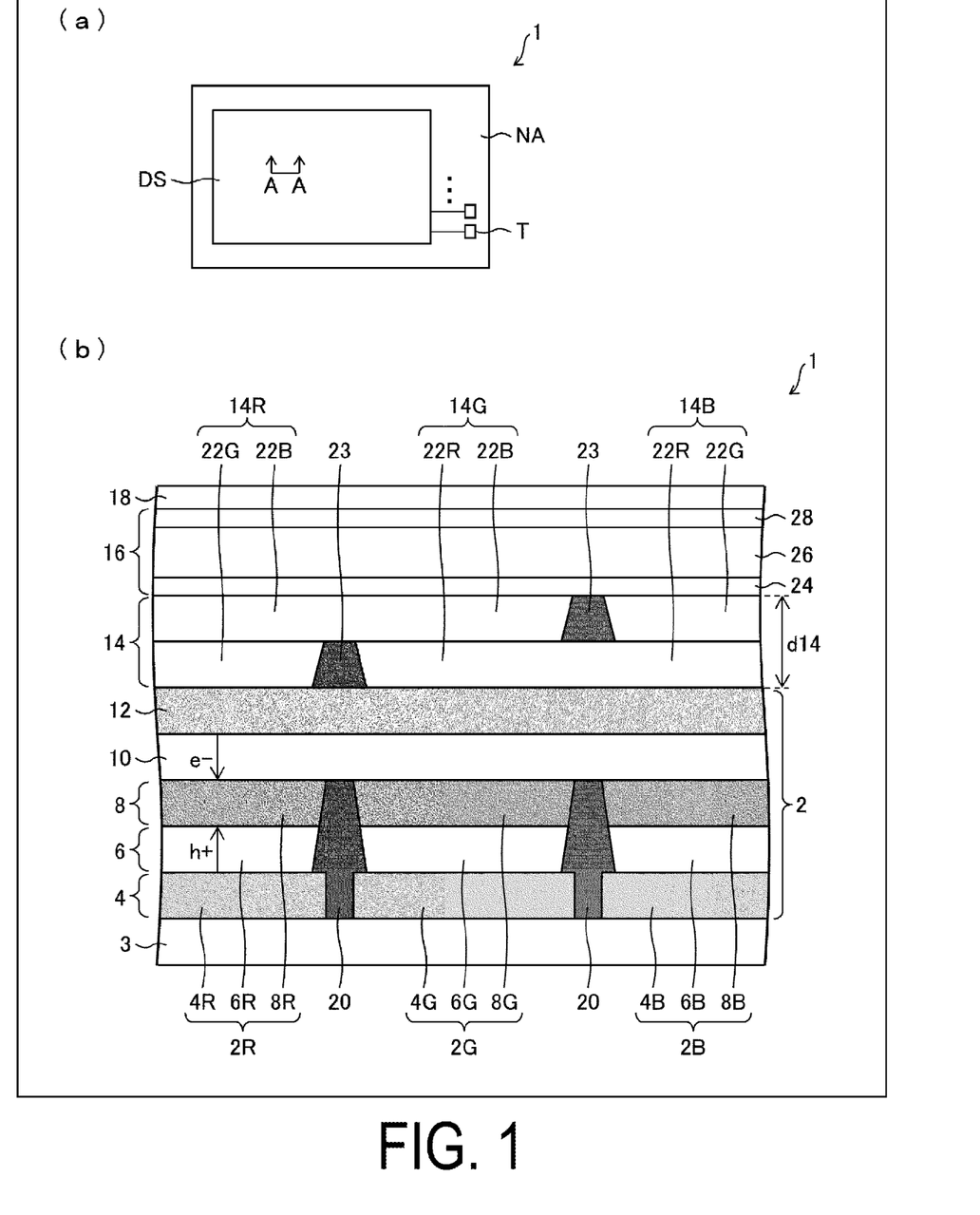
FIG. 1 is a schematic top view and a schematic cross-sectional view of a light-emitting device according to a first embodiment of the disclosure.

First Embodiment (a) of FIG. 1 is a schematic top view of a light-emitting device 1 according to the present embodiment. (b) of FIG. 1 is a cross-sectional view taken along a line A-A in the direction of the arrows in (a) of FIG. 1.

As illustrated in (a) of FIG. 1, the light-emitting device 1 according to the present embodiment includes a light-emitting face DS from Which light emission is extracted and a frame region NA surrounding a periphery of the light-emitting face DS. In the frame region NA, a terminal T may be formed into which a signal for driving a light-emitting element of the light-emitting device 1 described in detail later is input.

At a position superimposed on the light-emitting face DS in plane view, as illustrated in (b) of FIG. 1, the light-emitting device 1 according to the present embodiment includes a light-emitting element layer 2 and an array substrate 3. The light-emitting device 1 has a structure in which respective layers of the light-emitting element layer 2 are layered on the array substrate 3 in which a thin film transistor (TFT; not illustrated) is formed. In the present specification, a direction from the light-emitting element layer 2 to the array substrate 3 of the light-emitting device 1 is referred to as "downward direction", and a direction from the light-emitting element layer 2 to the light-emitting face DS of the light-emitting device 1 is referred to as "upward direction".

The light-emitting element layer 2 includes, on a first electrode 4, a first charge transport layer 6, a light-emitting layer 8, a second charge transport layer 10, and a second electrode 12, sequentially layered from the lower layer. The first electrode 4 of the light-emitting element layer 2 formed in the upper layer of the array substrate 3 is electrically connected to the TFT of the array substrate 3. Furthermore, the light-emitting device 1 includes a complementary color light absorption layer 14, a sealing layer 16, and a protection film 18 on a side of the light-emitting face DS of the second electrode 12.

In the present embodiment, the first electrode 4 is an anode electrode and the second electrode 12 is a cathode electrode. Further, without being limited thereto, the first electrode 4 may be a cathode electrode and the second electrode 12 may be an anode electrode.

In the present embodiment, the light-emitting element layer 2 includes a first light-emitting element 2R, a second light-emitting element 2G, a third light-emitting element 2B. The first light-emitting element 2R, the second light-emitting element 2G, and the third light-emitting element 2B may be organic EL elements, that is OLED elements, in which the light-emitting layer 8 includes an organic fluorescent material or an organic phosphorescent material. Furthermore, in addition to this, the first light-emitting element 2R, the second light-emitting element 2G, and the third light-emitting element 2B may be QLED elements in which the light-emitting layer 8 includes a semiconductor nanoparticle material, that is, a quantum dot material. However, in the present embodiment, the QLED elements or various light-emitting elements without being limited to the OLED elements can be used for the first light-emitting element 2R, the second light-emitting element 2G, and the third light-emitting element 2B.

Here, each of the first electrode 4, the first charge transport layer 6, and the light-emitting layer 8 is separated by edge covers 20. In particular, in the present embodiment, the first electrode 4 is, by the edge covers 20, separated into a first electrode 4R for the first light-emitting element 2R, a first electrode 4G for the second light-emitting element 2G, and a first electrode 4B for the third light-emitting element 2B. Further, the first charge transport layer 6 is, by the edge covers 20, separated into a first charge transport layer 6R for the first light-emitting element 2R, a first charge transport layer 6G for the second light-emitting element 2G, and a first charge transport layer 6B for the third light-emitting element 2B. Further, the light-emitting layer 8 is, by the edge covers 20, separated into a first light-emitting layer 8R, a second light-emitting layer 8G, and a third light-emitting layer 8B.

The second charge transport layer 10 and the second electrode 12 are not separated by the edge covers 20 and are formed in common. As illustrated in (b) of FIG. 1, the edge covers 20 may be formed so as to cover side surfaces and near peripheral end portions of an upper surface of the first electrode 4.

In the present embodiment, the first light-emitting element 2R includes the first electrode 4R, the first charge transport layer 6R, the first light-emitting layer 8R, the second charge transport layer 10, and the second electrode 12. The second light-emitting element 2G includes the first electrode 4G, the first charge transport layer 6G, the second light-emitting layer 8G, the second charge transport layer 10, and the second electrode 12. Furthermore, the third light-emitting element 2B includes the first electrode 4B, the first charge transport layer 6B, the third light-emitting layer 8B, the second charge transport layer 10, and the second electrode 12.

In the present embodiment, the first light-emitting layer 8R, the second light-emitting layer 8G, and the third light-emitting layer 8B emit red light, green light, and blue light, respectively. In other words, the first light-emitting element 2R, the second light-emitting element 2G, and the third light-emitting element 2B are light-emitting elements that emit the red light, the green light, and the blue light, respectively.

Here, the blue light is, for example, light having a light emission center wavelength in a wavelength band of 400 nm or more and 500 nm or less. Further, the green light is, for example, light having a light emission center wavelength in a wavelength band of greater than 500 nm and 600 nm or less. Further, the red light is, for example, light having a light emission center wavelength in a wavelength band of greater than 600 nm and 780 nm or less.

The first electrode 4 and the second electrode 12 include conductive materials and are electrically connected to the first charge transport layer 6 and the second charge transport layer 10, respectively. Of the first electrode 4 and the second electrode 12, the electrode closer to the light-emitting face DS is a semitransparent electrode. In the present embodiment, the first electrode 4 may be an anode electrode and the second electrode 12 may be a cathode electrode. However, without being limited thereto, the polarities of the first electrode 4 and the second electrode 12 may be reversed.

The first electrode 4 has a configuration in which ITO (Indium Tin Oxide) is layered on, for example, an Ag—Pd—Cu alloy. The first electrode 4 having the above configuration is a reflective electrode that reflects light emitted from the light-emitting layer 8. Therefore, among the light emitted from the light-emitting layer 8, light directed in the downward direction can be reflected by the first electrode 4.

On the other hand, the second electrode 12 is configured by, for example, a semitransparent Mg—Ag alloy. That is, the second electrode 12 is a transmissive electrode that transmits the light emitted from the light-emitting layer 8. Therefore, among the light emitted from the light-emitting layer 8, light directed in the upward direction passes through the second electrode 12. In this manner, the light-emitting device 1 can emit the light emitted from the light-emitting layer 8 in the upward direction.

As described above, in the light-emitting device 1, both the light emitted in the upward direction and the light emitted in the downward direction from the light-emitting layer 8 can be directed toward the second electrode 12 (upward direction). That is, the light-emitting device 1 is configured as a top-emitting type light-emitting device. Since both the light emitted in the upward direction from the light-emitting layer 8 and the light emitted in the downward direction from the light-emitting layer 8 are available as light emission from the light-emitting device 1, the light-emitting device 1 can improve the usage efficiency of the light emitted from the light-emitting layer 8.

In the present embodiment, the second electrode 12, which is a semitransparent electrode, may partially reflect the light emitted from the light-emitting layer 8. In addition, a cavity of the light emitted from the light-emitting layer 8 may be formed between the first electrode 4 which is a reflective electrode, and the second electrode 12 which is a semitransparent electrode. By forming the cavity between the first electrode 4 and the second electrode 12, the color level of the light emitted from the light-emitting layer 8 can be improved.

Note that the configuration of the first electrode 4 and the second electrode 12 described above is an example, and may be another configuration.

The light-emitting layer 8 is a layer that emits light due to the occurrence of recombination of positive holes transported from the first electrode 4 and electrons transported from the second electrode 12.

When the first light-emitting element 2R is an OLED element, the first light-emitting layer 8R may include, for example, Btp2Ir (acac) (bis-(3-(2-(2-pyridyl) benzothienyl) mono-acetylacetonate) iridium (III)) as a light emission dopant. Further, the first light-emitting layer 8R may include, for example, a CDBP (4,4'-bis (carbazole-9-yl)-2, 2'-dimethylbiphenyl) as a host material.

When the second light-emitting element 2G is an OLED element, the second light-emitting layer 8G may include, for example, Ir (ppy) 3 (tris (2-phenylpyridinato) iridium (III)) as a light emission dopant. Further, the second light-emitting layer 8G may include, for example, CBP (4,4'-di (N-carbazolyl) biphenyl) as a host material.

When the third light-emitting element 2B is an OLED element, the third light-emitting layer 8B may include, for example, DPVBi (4,4'-bis (2,2-diphenylvinyl) biphenyl) as a light emission dopant. Further, the third light-emitting layer 8B may include, for example, adamantine anthracene as a host material.

Furthermore, in a case where the first light-emitting element 2R, the second light-emitting element 2G, and the third light-emitting element 2B are QLED elements, the first light-emitting element 2R, the second light-emitting element 2G, and the third light-emitting element 2B may include, in the light-emitting layer 8, the quantum dot material similar to that used in known QLED elements. In other words, the first light-emitting layer 8R, the second light-emitting layer 8G, and the third light-emitting layer 8B may include a known quantum dot material used in light-emitting layers of red, green, and blue QLED elements, respectively.

The first charge transport layer 6 is a layer that transports charges from the first electrode 4 to the light-emitting layer 8. The first charge transport layer 6 may have a function of inhibiting the transport of charges from the second electrode 12. In the present embodiment, the first charge transport layer 6 may be a hole transport layer that transports positive holes from the first electrode 4, which is an anode electrode, to the light-emitting layer 8.

The second charge transport layer 10 is a layer that transports the charge from the second electrode 12 to the light-emitting layer 8. The second charge transport layer 10 may have a function of inhibiting the transport of the charges from the first electrode 4. In the present embodiment, the second charge transport layer 10 may be an electron transport layer that transports electrons from the second electrode 12, which is a cathode electrode, to the light-emitting layer 8.

The first charge transport layer 6, the light-emitting layer 8, and the second charge transport layer 10 may be formed by a traditionally known technique, and may be formed by, for example, vapor deposition using a vapor deposition mask.

The complementary color light absorption layer 14 is a layer that absorbs complementary color light of light from the light-emitting element layer 2. The complementary color light absorption layer 14 includes, in plane view, a first complementary color light absorption layer 14R at a position where the complementary color light absorption layer 14 is superimposed on the first light-emitting element 2R, a second complementary color light absorption layer 14G at a position where the complementary color light absorption layer 14 is superimposed on the second light-emitting element 2G, and a third complementary color light absorption layer 14B at a position where the complementary color light absorption layer 14 is superimposed on the third light-emitting element 2B, The first complementary color light absorption layer 14R absorbs complementary color light of red light, the second complementary color light absorption layer 14G absorbs complementary color light of green light, and the third complementary color light absorption layer 14B absorbs complementary color light of blue light.

Specifically, the complementary color light absorption layer 14 includes a red light absorption layer 22R that absorbs the red light, a green light absorption layer 22G that absorbs the green light, and a blue light absorption layer 22B that absorbs the blue light. The first complementary color light absorption layer 14R includes the green light absorption layer 22G and the blue light absorption layer 22B layered on each other. The second complementary color light absorption layer 14G includes the red light absorption layer 22R and the blue light absorption layer 22B layered on each other. Furthermore, the third complementary color light absorption layer 14B includes the red light absorption layer 22R and the green light absorption layer 22G layered on each other.

In other words, the first complementary color light absorption layer 14R absorbs, for example, light having a light emission center wavelength in a wavelength band of 400 nm or more to 500 nm or less and light having a light emission center wavelength in a wavelength band of greater than 500 nm and 600 nm or less as the complementary color light of the red light. In addition, the second complementary color light absorption layer 14G absorbs, for example, light having a light emission center wavelength in a wavelength band of 400 nm or more to 500 nm or less and light having a light emission center wavelength in a wavelength band of greater than 600 nm and 780 nm or less as the complementary color light of the green light. In addition, the third complementary color light absorption layer 14B absorbs, for example, light having a light emission center wavelength in a wavelength band of greater than 500 nm and 600 nm or less and light having a light emission center wavelength in a wavelength band of greater than 600 nm and 780 nm or less as the complementary color light of the blue light.

Here, the complementary color light absorption layer 14 has a structure in which at least two layers are layered among the red light absorption layer 22R, the green light absorption layer 22G, and the blue light absorption layer 22B. Furthermore, the complementary color light absorption layer 14 includes, in plane view, at least one layer in common at a position where the complementary color light absorption layer 14 overlaps the adjacent light-emitting element.

For example, as illustrated in (b) of FIG. 1, the complementary color light absorption layer 14 includes, in plane view, the blue light absorption layer 22B in common at positions where the complementary color light absorption layer 14 is superimposed on the first light-emitting element 2R and the second light-emitting element 2G that are adjacent to each other. Similarly, the complementary color light absorption layer 14 includes, in plane view, the red light absorption layer 22R in common at positions where the complementary color light absorption layer 14 is superimposed on the second light-emitting element 2G and the third light-emitting element 2B that are adjacent to each other. The green light absorption layer 22G may also be formed in common at positions where the complementary color light absorption layer 14 is superimposed on adjacent light-emitting elements.

The complementary color light absorption layer 14 may include an organic vapor deposition material. In this case, each layer of the complementary color light absorption layer 14 may be formed, for example, by the vapor deposition using a vapor deposition mask, or at least one layer may be formed by co-evaporation. For example, the first complementary color light absorption layer 14R may be formed as a single layer by co-evaporation of the materials of the red light absorption layer 22R and the green light absorption layer 22G. This can be applied to the second complementary color light absorption layer 14G and the third complementary color light absorption layer 14B.

In the present embodiment, the complementary color light absorption layer 14 may include at least one layer in common at positions where the complementary color light absorption layer 14 is superimposed on at least one set of adjacent light-emitting elements that emit light of different colors from each other. In particular, the complementary color light absorption layer 14 includes a layer formed in common to a plurality of the light-emitting elements, so that when each layer of the complementary color light absorption layer 14 is formed by the vapor deposition using a vapor deposition mask, the complementary color light absorption layer 14 can be formed using a vapor deposition mask having a simpler shape.

In the complementary color light absorption layer 14, note that two layers that are the same layer and absorb light of different colors from each other, may be divided by the edge covers 23. However, when each layer of the complementary color light absorption layer 14 is formed by separately patterning by vapor deposition using a vapor deposition mask, the formation of the edge covers 23 can be omitted.

Examples of the material that absorbs blue light and transmit green light and red light, include DNTT (dinaphthothienothiophene) and 3A (oligo (2,6-anthrylene) trimer), etc. Examples of the material that absorbs green light, weakly absorb blue light, and transmit red light, include tetracene and ADT (anthradithiophene), etc. Examples of the material that absorbs red light, weakly absorb green light, and transmit blue light, include H2Pc (anhydrous phthalocyanine), CuPc (copper phthalocyanine), and pentacene, etc. Examples of the material that absorbs red light, transmit green light, and absorb part of blue light include TIPS pentacene, etc.

Accordingly, the first complementary color light absorption layer 14R may include a single layer structure of tetracene or ADT, or may include a layered structure of DNTT or 3A and tetracene or ADT. The first complementary color light absorption layer 14R may be formed by co-evaporation of DNTT or 3A and tetracene or ADT.

Similarly, the second complementary color light absorption layer 14G may include a single layer structure of TIPS pentacene or may include a layered structure of DNTT or 3A and H2Pc, CuPc or pentacene. The second complementary color light absorption layer 14G may be formed by co-evaporation of DNTT or 3A and H2Pc, CuPc, or pentacene.

Similarly, the third complementary color light absorption layer 14B may include a single layer structure of H2Pc, CuPc, or pentacene, or may include a layered structure of tetracene or ADT and H2Pc, CuPc, or pentacene. The third complementary color light absorption layer 14B may be formed by co-evaporation of tetracene or ADT and H2Pc, CuPc, or pentacene.

The complementary color light absorption layer 14 also functions as a capping layer for each light-emitting element of the light-emitting element layer 2. In other words, the light-emitting device 1 includes, as the complementary color light absorption layer 14, a capping layer that comes into contact with the side of the light-emitting face DS of the second electrode 12. The capping layer functions of suppressing the generation of plasmon at the interface on the side of the light-emitting face DS of the second electrode 12. The capping layer improves the extraction efficiency of light emission from the light-emitting element layer 2. The capping layer may be a material whose refractive index is greater than that of atmosphere. Note that the first complementary color light absorption layer 14R, the second complementary color light absorption layer 14G, and the third complementary color light absorption layer 14B including the materials described above include functions as a capping layer.

The light-emitting device 1 in the present embodiment does not need to include a capping layer in addition to the complementary color light absorption layer 14, and it contributes to thinning the light-emitting device 1.

Note that the film thickness of the capping layer is preferably 1000 nm or less from the perspective of film-thinning and improving luminous efficiency of the light-emitting device 1. In other words, in the present embodiment, the film thickness d14 of the complementary color light absorption layer 14 is preferably 1000 nm or less.

The sealing layer 16 includes a first inorganic sealing film 24, an organic sealing film 26, and a second inorganic sealing film 28, which are layered from the side of light-emitting element layer 2 toward the side of light-emitting face DS, The first inorganic sealing film 24 and the second inorganic sealing film 28 have a function of preventing moisture or the like from entering each light-emitting element of the light-emitting element layer 2. The organic sealing film 26 has a function of sealing foreign matters in the upper layer of the light-emitting element layer 2, or a function as a buffer layer for the first inorganic sealing film 24 or the second inorganic sealing film 28. The protection film 18 is attached to the surface of the light-emitting device 1 to form the light-emitting face DS.

Figure 2:
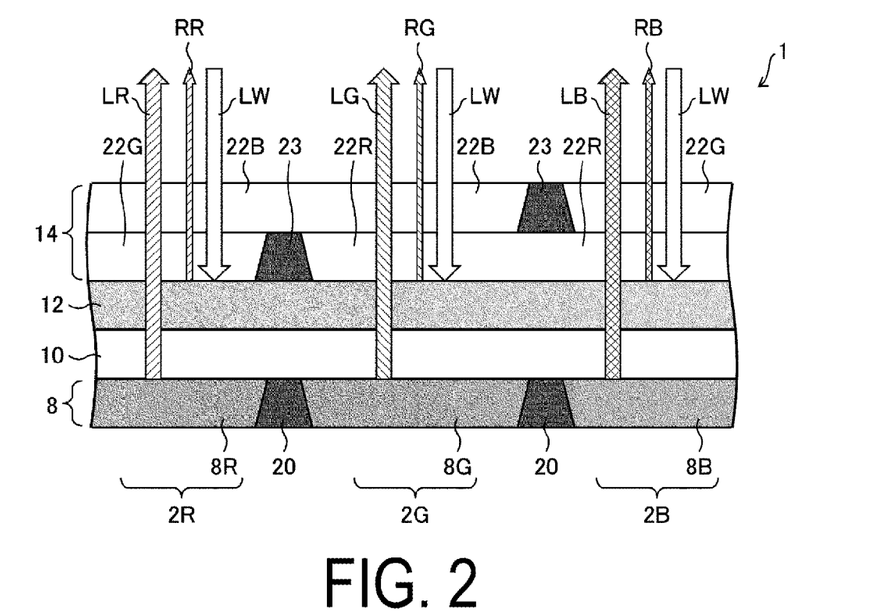
FIG. 2 is an enlarged cross-sectional view illustrating light emission from a light-emitting element of the light-emitting device according to the first embodiment of the disclosure and a mechanism for reducing external light reflection in the light-emitting device.

FIG. 2 is an enlarged cross-sectional view illustrating light emission from a light-emitting element layer 2 of the light-emitting device 1 according to the present embodiment, and a mechanism for reducing external light reflection in the light-emitting device. FIG. 2 includes an enlarged cross-sectional view in (b) of FIG. 1, from the light-emitting layer 8 to the complementary color light absorption layer 14.

For example, in the first light-emitting element 2R, it is assumed that red light LR is emitted from the first light-emitting layer 8R toward the light-emitting face DS. In FIG. 2, the red light LR is illustrated as light directly from the first light-emitting layer 8R toward the light-emitting face DS, but in practice the red light LR includes light reflected at the first electrode 4 from the first light-emitting layer 8R toward the first electrode 4.

The red light LR passes through the second electrode 12, which is a semitransparent electrode, and then passes through the first complementary color light absorption layer 14R. At this time, since the red light LR is not absorbed by the green light absorption layer 22G and the blue light absorption layer 22B, the red light LR is not greatly absorbed in the complementary color light absorption layer 14.

Here, it is assumed that external light LW is incident on the first light-emitting element 2R passing through the light-emitting face DS from the outside. It is assumed that the external light LW is a substantially white light including sunlight, etc. The external light LW is partially reflected by the second electrode 12, which is a semitransparent electrode. Furthermore, the external light LW that has passed through the second electrode 12 is also reflected by the first electrode 4. The light reflected at the first electrode 4 or the second electrode 12 is referred to as reflected light RR illustrated in FIG. 2.

The external light LW passes through the complementary color light absorption layer 14 twice, Thus, the proportion of light absorbed by the complementary color light absorption layer 14 thereof is large compared to the red light LR that passes through only once through the complementary color light absorption layer 14. Accordingly, the intensity of the reflected light RR, which is reflected by the external light LW, can be reduced compared to the red light LR from the light-emitting layer 8.

Furthermore, the external light LW passes through the first complementary color light absorption layer 14R, that is, the blue light absorption layer 22B and the green light absorption layer 22G. At this time, the wavelength component of the blue light of the external light LW is absorbed by the blue light absorption layer 22B, and the wavelength component of the green light is absorbed by the green light absorption layer 22G. Thus, the reflected light RR is substantially red light. As a result, the wavelength components of the red light LR and the reflected light RR are relatively close to each other, so the reflected light RR is difficult to be visibly recognized by a viewer of the light-emitting device 1.

The relationship between the red light LR and the reflected light RR is similar in the relationship between green light LG and reflected light RG in the second light-emitting element 2G and the relationship between blue light LB and reflected light Rb in the third light-emitting element 2B. Therefore, the light-emitting device 1 can reduce the reflected light of external light against the light emitted from the light-emitting element layer 2, whereby the reflected light can be difficult to be visibly recognized by the viewer of the light-emitting device 1.

In the present embodiment, the light-emitting device 1 absorbs the external light by the complementary color light absorption layer 14, whereby reduces the reflected light. Therefore, the light-emitting device 1 does not need to include a circular polarizer having a thick film compared to the complementary color light absorption layer 14, and it contributes to film-thinning and improving flexibility. In addition, since the light emission from the light-emitting element layer 2 is not greatly absorbed by the complementary color light absorption layer 14, the light-emitting device 1 can improve the light extraction efficiency, which leads to the improvement of luminous efficiency. Furthermore, the light-emitting device 1 does not include a circular polarizer, so that the color sticking that depends on the viewing angle with respect to the light-emitting face DS is reduced, whereby the viewing angle characteristics of the light-emitting device 1 are improved.

For each light-emitting element, the light-emitting device 1 includes the complementary color light absorption layer 14 that absorbs complementary color light of light from the light-emitting element. Thus, in the light-emitting layer 8, even in a case where a light-emitting layer that emits light of a specific color is formed in a light-emitting element that emits light having a color different from the specific color, light of the specific color can be absorbed in the complementary color light absorption layer 14. Thus, the possibility of color mixing between the light-emitting elements can be reduced.

Furthermore, even in a case where light from a light-emitting layer in each light-emitting element travels in the diagonal direction with respect to the light-emitting device 1, or in a case where the light is emitted from the second electrode 12 of the different light-emitting element after being guided in the planar direction, the light is absorbed by the complementary color light absorption layer 14. Therefore, stray light or color mixing can be suppressed between different light-emitting elements, whereby the contrast of the light-emitting device 1 is improved.

In the present embodiment, as illustrated in FIG. 1, the second electrode 12 and the complementary color light absorption layer 14 are in contact with each other. In this manner, in the present embodiment, it is preferable that the distance between the second electrode 12 and the complementary color light absorption layer 14 is closer from the perspective of improving the effects of suppressing stray light or color mixing between different light-emitting elements described above.

However, the second electrode 12 and the complementary color light absorption layer 14 may be formed at a certain distance. In addition, the first complementary color light absorption layer 14R, the second complementary color light absorption layer 14G, and the third complementary color light absorption layer 14B may be individually formed. Accordingly, each may have a different distance from the second electrode 12.

For example, each of the distance between the second electrode 12 and the first complementary color light absorption layer 14R, the distance between the second electrode 12 and the second complementary color light absorption layer 14G, and the distance between the second electrode 12 and the third complementary color light absorption layer 14B may be 1000 nm or less.

Note that the light-emitting device 1 according to the present embodiment is a flexible device. The sealing layer 16 is used for sealing the light-emitting device 1. However, without being limited thereto, the light-emitting device 1 in the present embodiment may be a rigid device, and the sealing of the light-emitting device 1 may be realized by a glass frit sandwiched between two glass substrates.

Second Embodiment

Figure 3:
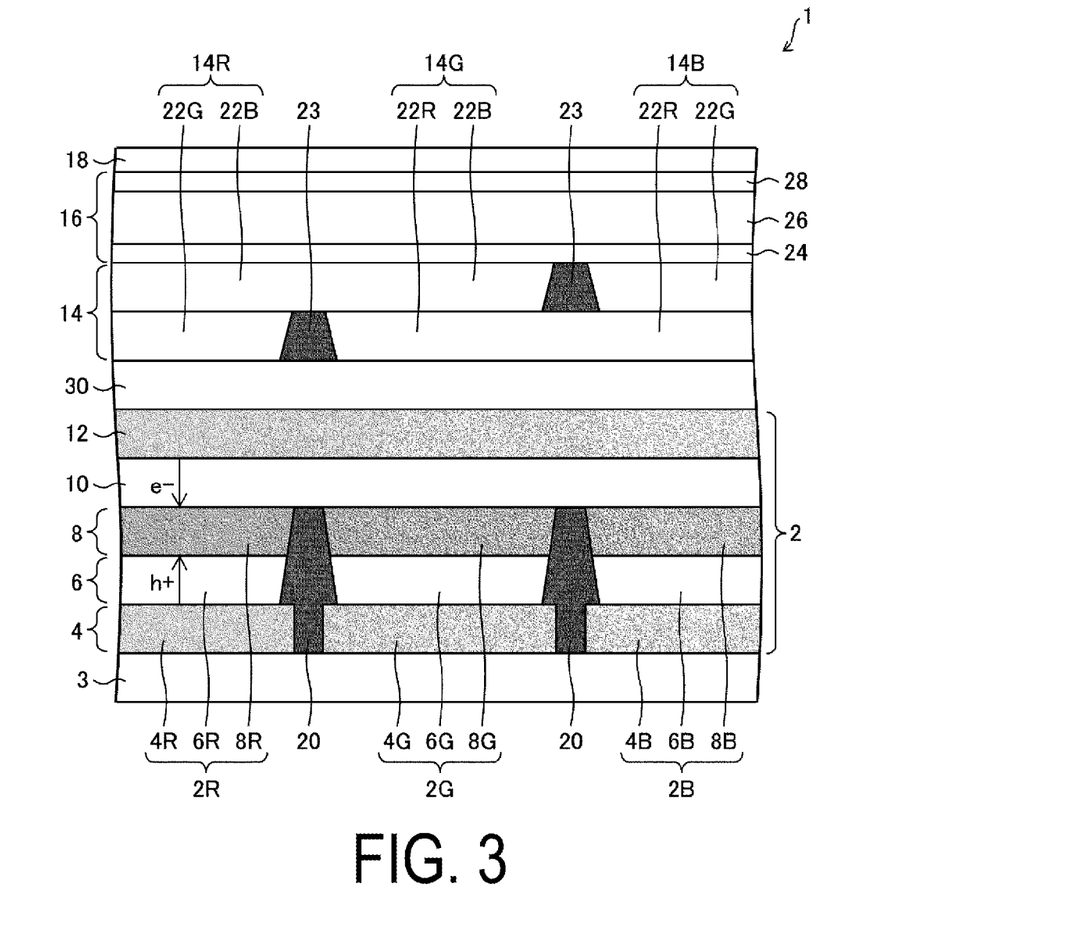
FIG. 3 is a schematic cross-sectional view of a light-emitting device according to a second embodiment of the disclosure.

FIG. 3 is a cross-sectional view, corresponding to (b) of FIG. 1, of the light-emitting device 1 according to the present embodiment. The light-emitting device 1 according to the present embodiment is different in configuration from the light-emitting device 1 according to the previous embodiment only in that a capping layer 30 is provided between the second electrode 12 and the complementary color light absorption layer 14.

In the present embodiment as well, the light-emitting device 1 contributes to thinning the film and improving luminous efficiency, as in the previous embodiment. Further, in the present embodiment, the light-emitting device 1 includes the capping layer 30 independently of the complementary color light absorption layer 14. As a result, the complementary color light absorption layer 14 does not need to serve as a capping layer, so that the types of materials that can be used as the material of the complementary color light absorption layer 14 increases, whereby the degree of freedom in design is improved. Further, the light-emitting device 1 may independently include the capping layer 30 to further improve the light extraction efficiency from the light-emitting element layer 2.

Modified Example

Figure 4:
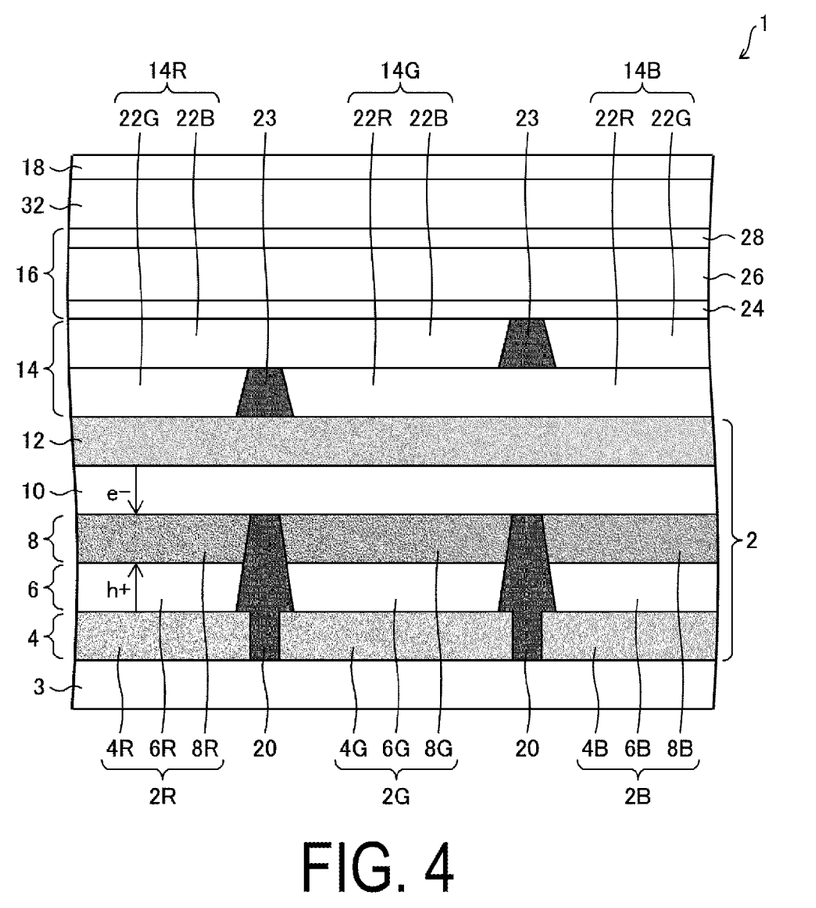
FIG. 4 is a schematic cross-sectional view of a light-emitting device according to a modified example of the disclosure.

FIG. 4 is a cross-sectional view of the light-emitting device 1 according to the modified example, corresponding to (b) of FIG. 1. The light-emitting device 1 according to the modified example is different in configuration from the light-emitting device 1 according to the first embodiment only in that a circular polarizer 32 is provided between the sealing layer 16 and the protection film 18. The circular polarizer 32 may have a structure in which, for example, a/4 plate and a linear polarizer are layered.

The light-emitting device 1 according to the present modified example includes the circular polarizer 32, to further reduce external light reflection. Furthermore, the light-emitting device 1 according to the present modified example reduces reduce the external light reflection even in the complementary color light absorption layer 14, whereby the circular polarizer 32 can be formed thinner than in the related art. Therefore, the present modified example also contributes to thinning the film and improving luminous efficiency, as in the embodiments described above. In particular, in a case where the light-emitting device 1 is a flexible device, the circular polarizer 32 may be thinned to a degree that does not hinder the flexibility, and a film circular polarizer may be used as the circular polarizer 32.

Third Embodiment

Figure 5:
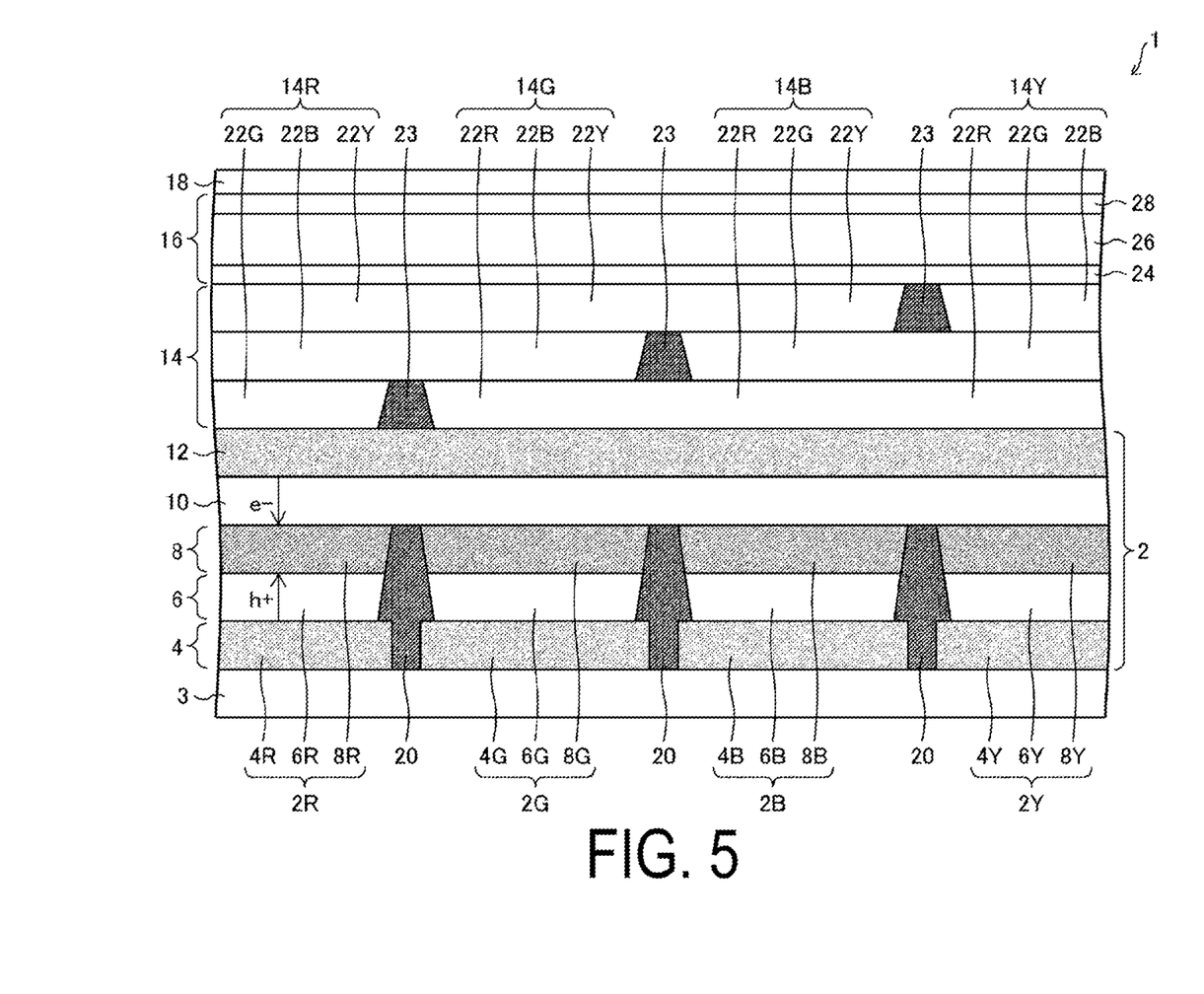
FIG. 5 is a schematic cross-sectional view of a light-emitting device according to a third embodiment of the disclosure.

FIG. 5 is a cross-sectional view of the light-emitting device 1 according to the present embodiment, corresponding to (b) of FIG. 1. The light-emitting device 1 according to the present embodiment is different in configuration from the light-emitting device 1 according to each of the above-described embodiments only in that the light-emitting element layer 2 further includes a fourth light-emitting element 2Y. The first electrode 4 and the first charge transport layer 6 each include a first electrode 4Y and a first charge transport layer 6Y. The fourth light-emitting element 2Y includes a first electrode 4Y, a first charge transport layer 6Y, a fourth light-emitting layer 8Y, the second charge transport layer 10, and the second electrode 12.

In addition, in the present embodiment, the first complementary color light absorption layer 14R, the second complementary color light absorption layer 14G, and the third complementary color light absorption layer 14B further include a yellow light absorption layer 22Y. Furthermore, in the present embodiment, the complementary color light absorption layer 14 further includes the fourth complementary color light absorption layer 14Y that includes the red light absorption layer 22R, the green light absorption layer 22G, and the blue light absorption layer 22B at a position where the complementary color light absorption layer 14 is superimposed on the fourth light-emitting element 2Y.

Except for the configuration described above, the light-emitting device 1 according to the present embodiment may include a configuration similar to that of the light-emitting device 1 according to each of the above-described embodiments.

In the present embodiment, the fourth light-emitting layer 8Y emits yellow light. In other words, the fourth light-emitting element 2Y is a light-emitting element that emits yellow light. Here, the yellow light is, for example, light having a light emission center wavelength in a wavelength band of 560 nm or more and 600 nm or less.

The fourth light-emitting layer 8Y may include, for example, Ir (BT) 2 (acac) (Bis (2-benzo [b] thiophen-2-ylpyridine) (acetylacetoneate) iridium (III)) as a light emission dopant. The fourth light-emitting layer 8Y may include, for example, CBF as a host material.

The yellow light absorption layer 22Y has a function of absorbing yellow light, that is, light having a light emission center wavelength in a wavelength band of 560 nm or more and 600 nm or less. The yellow light absorption layer 22Y is preferably formed using SubPC (subphthalocyanine), for example. Note that in the present embodiment, it is preferable that the green light absorption layer 22G does not absorb yellow light, that is, light having a light emission center wavelength in a wavelength band of 560 nm or more and 600 nm or less.

In the present embodiment as well, the effect of thinning the light-emitting device is achieved as in each of the above-described embodiments. Further, in the present embodiment, the color reproducibility of the light-emitting device 1 can be improved by further providing the fourth light-emitting element 2Y that emits yellow light.

Supplement

The light-emitting device of aspect 1 includes a light-emitting face, and a light-emitting element in which a first electrode, a light-emitting layer, and a second electrode are sequentially layered toward a side of the light-emitting face, wherein the light-emitting device includes a complementary color light absorption layer on the side of the light-emitting face of the second electrode, and the complementary color light absorption layer absorbs complementary color light of light emitted by the light-emitting element.

In aspect 2, the light-emitting element includes a first light-emitting element configured to emit red light, a second light-emitting element configured to emit green light, and a third light-emitting element configured to emit blue light, and the complementary color light absorption layer includes, in plane view, a first complementary color light absorption layer configured to absorb complementary color light of the red light at a position where the complementary color light absorption layer is superimposed on the first light-emitting element, a second complementary color light absorption layer configured to absorb complementary color light of the green light at a position where the complementary color light absorption layer is superimposed on the second light-emitting element, and a third complementary color light absorption layer configured to absorb complementary color light of the blue light at a position where the complementary color light absorption layer is superimposed on the third light-emitting element.

In aspect 3, the complementary color light absorption layer includes a plurality of layers layered, and at least one layer of the plurality of layers is provided in common at a position where the complementary color light absorption layer is superimposed on at least one set of the adjacent light-emitting elements that emit light of different colors from each other, among the first light-emitting element, the second light-emitting element, and the third light-emitting element.

In aspect 4, the first complementary color light absorption layer includes a green light absorption layer configured to absorb green light and a blue light absorption layer configured to absorb blue light in a layered manner.

In the aspect 5, the second complementary color light absorption layer includes a red light absorption layer configured to absorb red light and a blue light absorption layer configured to absorb blue light in a layered manner.

In the aspect 6, the third complementary color light absorption layer includes a red light absorption layer configured to absorb red light and a green light absorption layer configured to absorb green light in a layered manner.

In aspect 7, each of a distance between the second electrode and the first complementary color light absorption layer, a distance between the second electrode and the second complementary color light absorption layer, and a distance between the second electrode and the third complementary color light absorption layer is 1000 nm or less.

In aspect 8, the light-emitting element includes a first light-emitting element configured to emit red light, a second light-emitting element configured to emit green light, a third light-emitting element configured to emit blue light, and a fourth light-emitting element configured to emit yellow light, and the complementary color light absorption layer includes, in plane view, a first complementary color light absorption layer configured to absorb complementary color light of the red light at a position where the complementary color light absorption layer is superimposed on the first light-emitting element, a second complementary color light absorption layer configured to absorb complementary color light of the green light at a position where the complementary color light absorption layer is superimposed on the second light-emitting element, a third complementary color light absorption layer configured to absorb complementary color light of the blue light at a position where the complementary color light absorption layer is superimposed on the third light-emitting element, and a fourth complementary color light absorption layer configured to absorb complementary color of the yellow light at a position where the complementary color light absorption layer is superimposed on the fourth light-emitting element.

In aspect 9, a capping layer facing the side of the light-emitting face of the second electrode is provided.

In aspect 10, the capping layer is configured to serve as the complementary color light absorption layer.

In aspect 11, a film thickness of the complementary color light absorption layer is 1000 nm or less.

In aspect 12, the second electrode is a cathode electrode.

In aspect 13, the second electrode is provided in common to a plurality of the light-emitting elements.

In aspect 14, a sealing layer is provided on the side of the light-emitting face of the complementary color light absorption layer.

In aspect 15, the complementary color light absorption layer is provided between the second electrode and the sealing layer.

In aspect 16, the sealing layer includes a first inorganic sealing film, an organic sealing film, and a second inorganic sealing film layered.

In aspect 17, a circular polarizer is not provided on the side of the light-emitting face of the complementary color light absorption layer.

In aspect 18, a circular polarizer is provided on the side of the light-emitting face of the complementary color light absorption layer.

The disclosure is not limited to the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in the embodiments.

The invention claimed is:

1. A light-emitting device comprising:
   a light-emitting face;
   a plurality of light-emitting elements in each of which a first electrode, a light-emitting layer, and a second electrode are sequentially layered toward a side of the light-emitting face,
   wherein each of the plurality of light-emitting elements includes a first light-emitting element configured to emit a first color light, a second light-emitting element configured to emit a second color light being different in color from the first color light, and a third light-emitting element configured to emit a third color light being different in color from the first color light and the second color light;
   on the side of the light-emitting face of each of the plurality of light-emitting elements, a complementary color light absorption layer configured to absorb complementary color light of light emitted by each of the plurality of light-emitting elements; and
   a sealing layer provided on the side of the light-emitting face of the complementary color light absorption layer, wherein
   the complementary color light absorption layer includes, in a plane view, a first complementary color light absorption layer configured to absorb complementary color light of the first color light at a position where the complementary color light absorption layer is superimposed on the first light-emitting element, a second complementary color light absorption layer configured to absorb complementary color light of the second color light at a position where the complementary color light absorption layer is superimposed on the second light-emitting element, and a third complementary color light absorption layer configured to absorb complementary color light of the third color light at a position where the complementary color light absorption layer is superimposed on the third light-emitting element.

2. The light-emitting device according to claim 1,
   wherein the complementary color light absorption layer further includes a plurality of layers layered, the plurality of layers including the first complementary color light absorption layer, the second complementary color light absorption layer, and the third complementary color light absorption layer, and
   at least one layer of the plurality of layers is provided in common at positions where the complementary color light absorption layer is superimposed on at least one set of adjacent light-emitting elements that, among the first light-emitting element, the second light-emitting element, and the third light-emitting element, emit light of different colors from each other.

3. The light-emitting device according to claim 1,
   wherein the first color light is a red light, and
   the first complementary color light absorption layer includes a green light absorption layer configured to absorb green light and a blue light absorption layer configured to absorb blue light in a layered manner.

4. The light-emitting device according to claim 1,
   wherein the second color light is a green light, and
   the second complementary color light absorption layer includes a red light absorption layer configured to absorb red light and a blue light absorption layer configured to absorb blue light in a layered manner.

5. The light-emitting device according to claim 1,
   wherein the third color light is a blue light, and
   the third complementary color light absorption layer includes a red light absorption layer configured to absorb red light and a green light absorption layer configured to absorb green light in a layered manner.

6. The light-emitting device according to claim 1,
   wherein each of a distance between the second electrode and the first complementary color light absorption layer, a distance between the second electrode and the second complementary color light absorption layer, and a distance between the second electrode and the third complementary color light absorption layer is 1000 nm or less.

7. The light-emitting device according to claim 1,
   wherein each of the plurality of light-emitting elements further includes a fourth light-emitting element configured to emit a fourth color light being different in color from any of the first color light, the second color light, and the third color light, and
   the complementary color light absorption layer further includes, in the plane view, a fourth complementary color light absorption layer configured to absorb complementary color of the fourth color light at a position where the complementary color light absorption layer is superimposed on the fourth light-emitting element.

8. The light-emitting device according to claim 1, further comprising:
   a capping layer facing the side of the light-emitting face of the second electrode.

9. The light-emitting device of claim 8,
   wherein the capping layer is configured to serve as the complementary color light absorption layer.

10. The light-emitting device according to claim 8,
    wherein a film thickness of the complementary color light absorption layer is 1000 nm or less.

11. The light-emitting device according to claim 1, wherein the second electrode is a cathode electrode.

12. The light-emitting device according to claim 1, wherein the second electrode is provided in common to the plurality of light-emitting elements.

13. The light-emitting device according to claim 1, wherein the sealing layer includes a first inorganic sealing film, an organic sealing film, and a second inorganic sealing film in a layered manner.

14. The light-emitting device according to claim 1, wherein a circular polarizer is not provided on the side of the light-emitting face of the complementary color light absorption layer.

15. The light-emitting device according to claim 1, further comprising:
a circular polarizer provided on the side of the light-emitting face of the complementary color light absorption layer.

16. The light-emitting device according to claim 1, wherein the complementary color light absorption layer is in contact with the side of the light-emitting face of the second electrode.

\* \* \* \* \*